United States Patent [19]

Weresch

[11] 4,276,796
[45] Jul. 7, 1981

[54] APPARATUS FOR CUTTING TO LENGTH THE CONNECTING WIRES OF ELECTRICAL COMPONENTS

[76] Inventor: Thomas Weresch, Greschbachstr. 19, D-7500 Karlsruhe 41, Fed. Rep. of Germany

[21] Appl. No.: 18,515

[22] Filed: Mar. 8, 1979

[30] Foreign Application Priority Data

Apr. 1, 1978 [DE] Fed. Rep. of Germany ....... 2814182

[51] Int. Cl.³ .............................................. B26D 1/24
[52] U.S. Cl. ...................................... 83/167; 83/422; 83/425; 83/444; 83/500; 83/345
[58] Field of Search ................. 83/167, 345, 425, 444, 83/449, 500, 501, 502, 503, 491, 925 R, 422, 675, 436; 140/71 R, 139, 140; 30/240

[56] References Cited

U.S. PATENT DOCUMENTS

| | | | |
|---|---|---|---|
| 2,592,019 | 4/1952 | Farnett | 83/500 X |
| 2,777,477 | 1/1957 | Zimmerman | 140/71 R |
| 2,929,289 | 3/1960 | Gorecki | 140/71 R X |
| 3,135,305 | 6/1964 | Bickel | 83/422 |
| 3,701,298 | 10/1972 | Heller et al. | 83/925 R X |
| 3,799,017 | 3/1974 | Halligan | 83/167 |
| 3,935,773 | 2/1976 | Daebler | 83/345 X |
| 4,028,973 | 6/1977 | Bogdanski et al. | 83/501 X |

Primary Examiner—Frank T. Yost
Assistant Examiner—Robert P. Olszewski
Attorney, Agent, or Firm—Craig and Antonelli

[57] ABSTRACT

Apparatus for cutting to length the connecting wires of electrical components (such as resistors, capacitors, transistors or diodes) comprises a cutting device situated below a component guide which consists of a slideway defining a guide slot through which the connecting wires project downwardly. The cutting device comprises two shearing wheels which are arranged with horizontal faces thereof parallel and abutting one another in a region in which they overlap, the forward point of intersection of peripheral cutting edges of the wheel (the point at which cutting of the connecting wires commences) being situated below the guide slot. At least one of the wheels is driven and this has serrations at its periphery which are large in relation to the diameter of the connecting wires to be cut. The non-driven wheel is preferably of truncated conical shape widening towards the other wheel. Various other constructional details are described, including up-and-down adjustment of the position of the shearing wheels, guiding arrangements, cut-end discharge arrangements and the provision of conveying roller which provides for firm movement of each component past the cutting device.

17 Claims, 4 Drawing Figures

APPARATUS FOR CUTTING TO LENGTH THE CONNECTING WIRES OF ELECTRICAL COMPONENTS

BACKGROUND AND SUMMARY OF THE INVENTION

The invention relates to an apparatus for cutting to length the connecting wires of electrical components, the apparatus comprising a component guide and a cutting device arranged below the component guide.

Electrical components such as resistances, capacitors, transistors, diodes etc are normally supplied by the manufacturer provided with connecting wires which have a considerable amount of oversize and have to be cut by the user to the size necessary for the particular use intended in a specific circuit arrangement. In apparatus of the type initially described above, which are known (from actual practice) and carry out this task, the components are introduced individually by hand into a component guide which usually consists essentially of holders for the connecting wires which are to be cut to the desired length. Below the component guide there is arranged at the necessary spacing a cutting device which shortens the connecting wires to the intended size. Then the component processed is taken from the component guide and a new component for cutting to the desired length is introduced. These known apparatus allow only a relatively slow throughput of components and involve considerable expense on labor.

Apparatus of another kind are also known (compare German laid-open specification No. 24 00 307) which have a different construction and are not arranged simply for cutting to length the connecting wires of electrical components but also bend the connecting wires and provide them with bent portions or corrugations. However, these apparatus of a different category are suitable only for dealing with components which have coaxially arranged connecting wires. Components which have a plurality of connecting wires arranged at one side of the component body or in a completely irregular manner cannot be processed with this kind of apparatus. An object of the invention is to provide an apparatus of the kind described initially above whereby it is possible with a small expense on labor, that is to say with very substantial automation, to cut the connecting wires to the intended size with a good standard of precision, and with a high throughput of components. A more specific object is to provide such apparatus which can be made robustly and to operate in a trouble-free manner and which can be used for a wide range of wire diameters.

To this end, according to the present invention, the component guide consists of a slideway which comprises a guide slot through which the connecting wires can extend downwardly, the cutting device comprises two shearing wheels which are each provided with a peripheral cutting edge and at least one of which is adapted to be driven in rotational movement, the shearing wheels are arranged with the peripheral cutting edges abutting on one another and being arranged to partly overlap one another, and at least the front intersection point of the peripheral cutting edges, considered in the direction of rotation of the driven cutting wheel, is situated below the guide slot.

In use of apparatus according to the invention, components are continuously fed-in by the slideway, and the connecting wires which are to be cut to length extend downwardly through the guide slot and come into the working region of the cutting device. The latter consists of two shearing wheels. At least one of these, that which is referred to hereinafter as the working wheel, is adapted to be driven in rotational movement by a motor whilst the other wheel, referred to hereinafter as the co-operating wheel, usually does not have any drive of its own. From the partly overlapping arrangement of the shearing wheels it follows that their peripheral cutting edges intersect at two points. The arrangement is made such that the peripheral speed of the working wheel at the forward of the two intersection points has at least one component which is parallel to the guide slot and in the direction of conveyance of the electrical components, so that these are drawn into the angle between the shearing wheels at the front intersection point and are cut off by the peripheral cutting edges abutting on one another. In order that this should take place smoothly it is provided that at least the forward point of intersection is situated below the guide slot, in other words in the slot plane. Within the framework of the invention what is understood as the slot plane is a plane which contains the guide slot and is situated at right angles to the boundaries of the guide slot; in other words, the connecting wires of the fed-in electrical components are normally situated in the slot plane.

A symmetrical arrangement, which is particularly simple from the constructional point of view, is achieved if the axes of rotation of the shearing wheels are so arranged relatively to the guide slot that the common chord of the shearing wheels (which connects the points of intersection) is situated below and in the direction of the guide slot. In some cases it may also be advisable to have an arrangement wherein the guide slot in the region of the front point of intersection of the peripheral cutting edges extends approximately tangentially relatively to the upper shearing wheel. With such an arrangement the result is achieved that the connecting wires, after being cut to length, can pass the upper shearing wheel without substantial lateral deflection, so that a particularly uniform, smooth passage of the electrical components through the apparatus is achieved.

It is advisable to arrange the shearing wheels with their axes parallel to one another so that they abut on one another with flat faces directed towards one another. Preferably the non-driven shearing wheel, i.e. the co-operating wheel, is mounted to be freely rotatable and bears on the working wheel under the action of gravitational force and/or spring action, but at any rate yieldably. This is particularly simple to arrange constructionally, results in an extremely reliable cutting-off of the connecting wires, and also has the result that the peripheral cutting edges are always kept sharp.

In order that the connecting wires are engaged and sheared off reliably, the arrangement should be such that the tangents of the shearing wheels form an acute angle with one another at the points of intersection. But this kind of arrangement makes it necessary to have a cutting device of relatively large dimensions, which is in many cases undesirable, and yet often still does not ensure a completely smooth operation. Therefore, according to the invention it is also proposed that the working wheel comprises serrations at its periphery whilst the co-operating wheel is usually provided with a smooth peripheral contour. The connecting wires are engaged by the serrations and effectively guided against the co-operating wheel with a shearing action. The serrations provided are preferably not the usual "teeth" as on a gear wheel, and on the contrary it is advisable to form the serrations as a knurling which is coarse relative to the diameter of the connecting wires which are to be cut. The contour of the knurling consists preferably of triangles following one another and provided with substantially straight boundaries. "Coarse" means that the depth between the serration projections of the knurling corresponds, as regards the order of magnitude, to the wire diameter. This depth is not particularly critical, and it is readily possible to cut all wire diameters which are likely to occur in actual practice with a suitably selected serration arrangement. The flank angle of the serration projections depends in more detail on the diameter and arrangement of the shearing wheel and is preferably not chosen with too acute an angle, so that a pulling cut is carried out on all wire diameters without any great impact stresses. It has also been found advantageous to construct the co-operating wheel as a truncated cone which widens slightly towards the working wheel so that the peripheral cutting edge is slightly acute-angled in cross-section. This results in a still quieter cut without much impact load.

In a particularly advantageous constructional form of an apparatus according to the invention it is proposed that the shearing wheels are mounted in a drive block—preferably at the top of the said block—and the said block can be lifted and lowered relatively to the guide slot. Usually the drive motor for the working wheel is also flange-mounted on the drive block. For lifting and lowering the drive block can be guided on guide rods and adjusted by means of a spindle which is integral with the housing and a spindle nut which is adapted to rotate in the drive block. By means of these measures the connecting wires can be cut to an adjustable length. It is also advantageous to provide the drive block with a longitudinal slot which is associated with the guide slot and in which the connecting wires can be guided when being fed to the cutting device. Downstream of the shearing wheels, as considered in the direction in which the electrical components are conveyed, the longitudinal slot opens downwardly into a discharge and/or reception container for the cut-off ends of wire, this being a particularly advantageous feature which ensures in a particularly simple manner that the cut-off wire ends are not scattered in an uncontrolled manner and thereby possibly causing a blockage or other operational disturbance.

Uniform feeding of the electrical components can be achieved in various ways. A first possible method is to arrange the guide slot of the slideway for the components with a downward gradient towards the shearing wheels, so that the said components are fed onwards by the action of gravitational force. For this purpose, for example, the entire apparatus including the cutting device can be set up with a suitable and preferably adjustable inclination. The slideway can also consist of two parallel, flexible, spring steel rails which are arranged with a spacing and which, with the cutting device stationary, can be lifted or lowered as required and in any case ensure a transition without any break to the cutting device. On the other hand—particularly in the case of high operating speeds—it may be advantageous to connect-on a special conveying means, for example in the form of a shaker conveyor, vibrator or the like. A further possibility which is particularly suitable in conjunction with an inclined guide slot is to arrange above the guide slot, in the region of the shearing wheels, a conveying roller which can be driven in rotary movement about an axis which is perpendicular to the plane of the slot. This results in the first instance in a uniform feeding of the components, and in addition the conveying roller at the same time acts as a device for holding the workpiece down during cutting, so that in spite of the shock which is not completely avoidable it is possible to provide satisfactory guiding. Of course the conveying roller rotates in the direction in which the components are conveyed, and preferably consists of a soft elastomer, foamed plastics material or the like, and in one preferable constructional form is arranged to be vertically adjustable in accordance with the dimensions of the components. A further and particularly inexpensive measure for improving the guiding of the components consists in arranging guide rails at an adjustable spacing at both sides of the guide slot at least in the region of the shearing wheels. This measure also has the result of inhibiting uncontrolled movements of the components in the region of the cutting device.

The apparatus according to the invention requires only little constructional expense and makes it possible for the connecting wires of electrical components to be cut to the intended length simply and reliably. It does not require any manual intervention once it has been set, and it operates continuously with a very high throughput of components. Thus the apparatus according to the invention allows a considerable rationalisation in the preparation of electrical components for building into circuit arrangements, and is particularly suitable as a component part of a unit construction system which includes other processing apparatus such as apparatus for bending the connecting wires, shaping them with bends or corrugations, etc.

BRIEF DESCRIPTION OF THE DRAWINGS

The invention will be now be described, by way of example, with reference to the accompanying drawings in which.

DETAILED DESCRIPTION OF THE PREFERRED EMBODIMENTS

Figure 1:
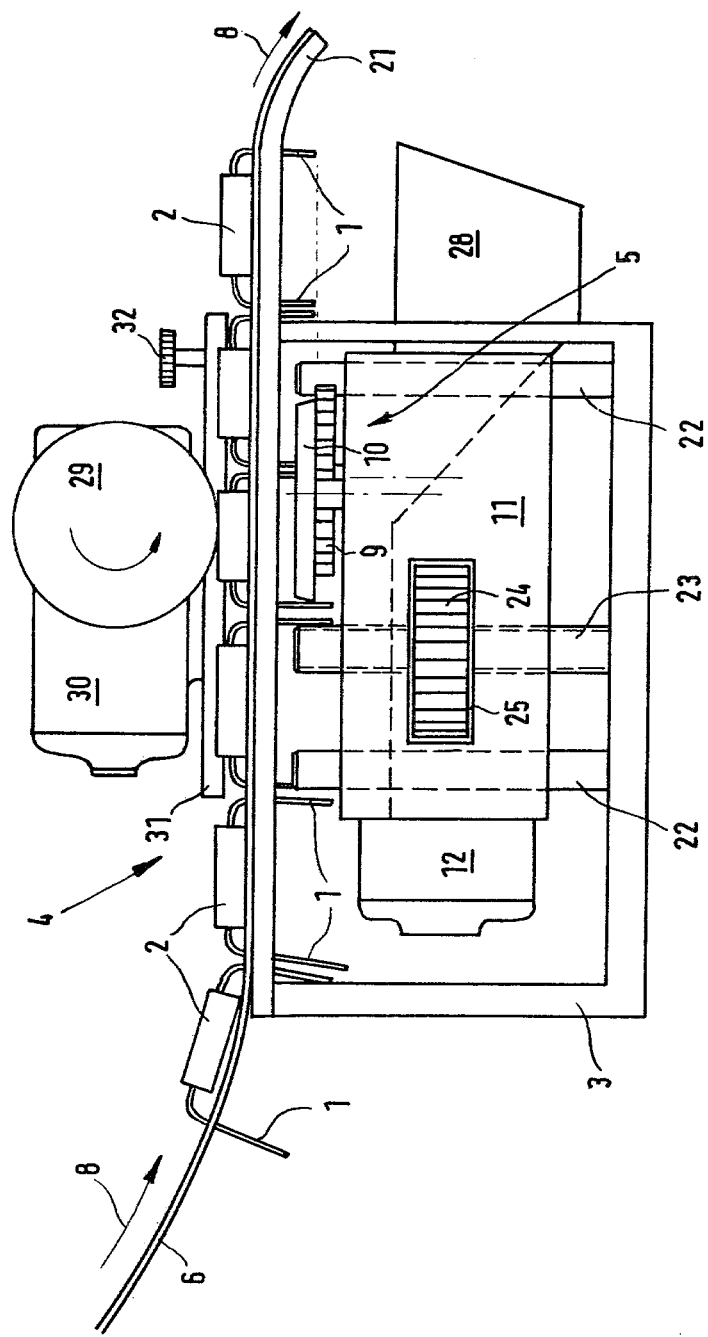
FIG. 1 shows an apparatus for cutting connecting wires of electrical components to a desired length, in side view with the side wall removed.

The apparatus shown in the drawings is used for cutting the connecting wires 1 of electrical components (for example capacitors 2) to a desired length and consists in its basic construction of a basic frame 3, a component guide 4 which is arranged at the top of the said frame, and a cutting device 5 situated below the component guide 4.

The component guide 4 is constructed as a slideway and comprises substantially two cheeks 6 made of spring steel which are parallel to one another and spaced from one another, are secured on the top of the frame 3 and leave free between themselves a guide slot 7. The components 2 are guided to the apparatus in the direction of conveying indicated by the arrow 8, the components 2 lying on the cheeks 6 and the connecting wires 1 extending downwards through the guide slot 7.

Although in the illustrated constructional example the connecting wires 1 are shown with a relatively regular shape, it is quite possible also to process components whose connecting wires are bent to substantially irregular shapes. The components 2 are fed-in in the illustrated example primarily by the fact that the cheeks 6 forming the component guide are arranged with a downward gradient and because of their flexibility have a smooth transition into the region of the cutting device 5. The cutting device 5 comprises more particularly two shearing wheels namely a working wheel 9 and a co-operating wheel 10, these being arranged to be capable of rotating in a drive block 11. The working wheel 9 is capable of being driven in rotational movement by a motor 12 by means of a transmission not shown in detail here. The co-operating wheel 10 is inserted with a pin 13 into a corresponding hole in the drive block 11 and is freely rotatable. The shearing wheels 9, 10 each comprise a peripheral cutting edge 14, and are arranged one above the other with their peripheral cutting edges 14 abutting on one another, and they are capable of rotating about axes which are parallel to one another so that their faces abut on one another. The axes of rotation of the shearing wheels 9, 10 are offset relative to one another so that the shearing wheels 9, 10 partly overlap one another and the peripheral cutting edges 14 accordingly intersect at two points. The front intersection point 15 is arranged below the guide slot 7 so that the connecting wires 1 are conducted directly into the working region between the shearing wheels 9, 10. The direction of rotation of the working wheel 9 as shown by the arrow 16 is so selected that the peripheral speed at the front point of intersection has a component which is directed in the same direction of conveying 8 of the electrical components 2. The co-operating wheel 10 arranged above the driving wheel 9 is made to abut on the working wheel 9 simply by the action of gravitational force. The axes of rotation of the working wheel and the co-operating wheel are arranged so that the guide slot 7 at the front point of intersection 15 extends tangentially relatively to the co-operating wheel 10 so that the connecting wires 1 do not collide with the co-operating wheel 10 to any considerable extent on passing further through the apparatus. This means that the common chord 17 of the shearing wheels 9, 10 extends at an inclination relatively to the guide slot 7 starting from the front point of intersection 15.

Figure 4:
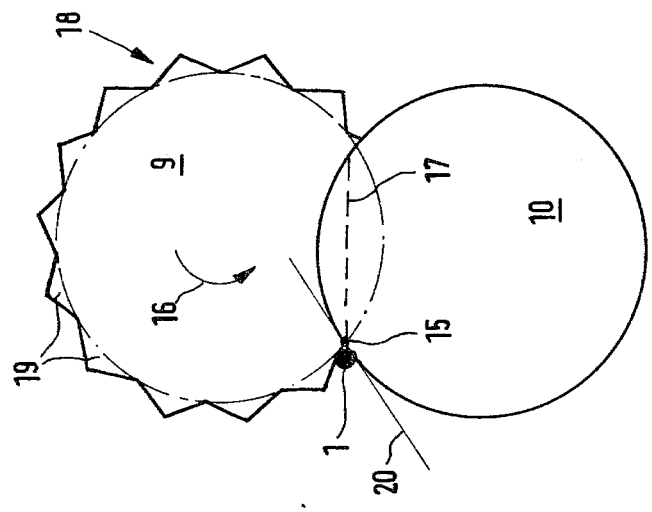
FIG. 4 shows diagrammetically a plan view of the shearing wheels of an apparatus according to FIGS. 1 to 3.
Figure 3:
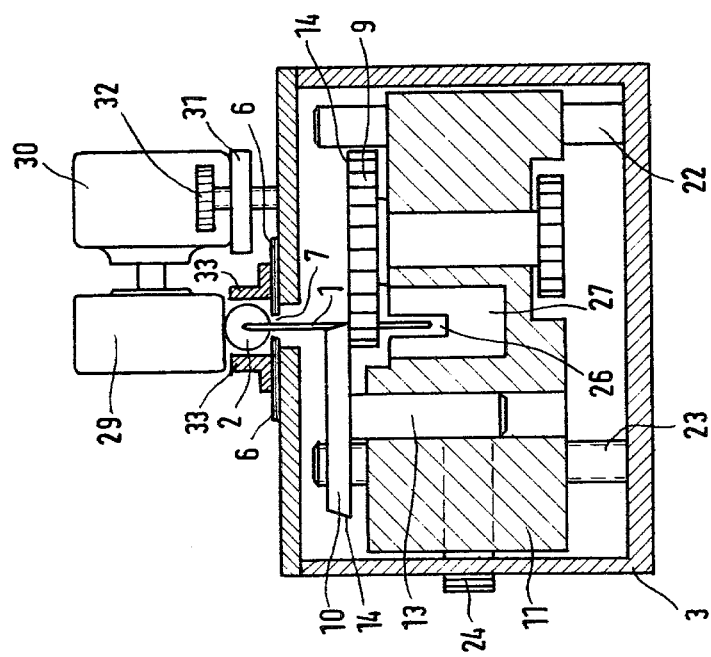
FIG. 3 shows the subject of FIG. 1 in a section on III—III in FIG. 2.

As the drawings show clearly the working wheel 9 is provided at its periphery with serrations in the form of relatively coarse knurling 18. These features are shown more clearly in FIG. 4. It can be seen how the knurling 18 comprises obtuse-angled isosceles triangles following one another and the flanks of the serrations at the front point of intersection 15 form an acute angle with the tangent 20 to the peripheral cutting edge 14 of the co-operating wheel 10. As a result the connecting wires 1 are reliably engaged and are cut through cleanly and without impact stresses. The co-operating wheel 10 is provided with a smooth peripheral contour and, as FIGS. 1 and 3 show, is widened in the manner of a truncated cone towards the working wheel 9.

When the apparatus described operates, the components 2 with their connecting wires 1 extending through the guide slot 7 are conveyed into the region of the cutting device 5. Here, the connecting wires are in each case engaged individually between working wheel and co-operating wheel and cut to the intended length. The end portions of the connecting wires 1 remaining on the components 2 pass above the working wheel 9 and beside the co-operating wheel 10 out of the cutting device 10 until the processed components 1 are discharged downstream of the cutting device 5 by means of a chute 21 connected to the component guide 4.

Figure 2:
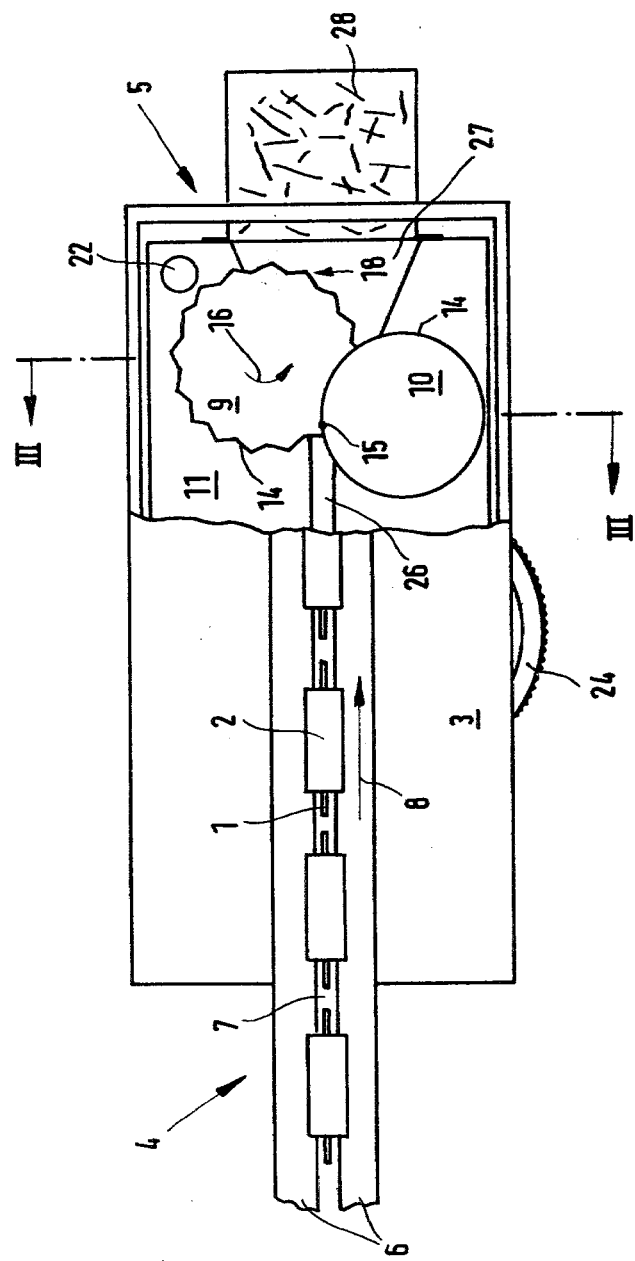
FIG. 2 shows the subject of FIG. 1 in plan view, partly broken away.

To adjust the intended lengths for the connecting wires, the drive block 11, on which the shearing wheels 9, 10 are mounted and to which the motor 12 is flange-connected, is capable of being lifted and lowered relatively to the guide slot 15. For this purpose the drive block 11 is guided by vertical guide rods 22 and a spindle 23 integral with the housing. Vertical adjustment is effected with a spindle nut 24 which is capable of rotating in the drive block 11 but is secured to be axially non-displaceable and is also capable of being operated through an aperture 25 in the side wall of the apparatus (compare FIGS. 1 and 2). The drive block 11 comprises a longitudinal slot 26 which forms a passage for the sometimes relatively long connecting wires 1 and constitutes an additional guiding means for these wires at the same time. The longitudinal slot 26 downstream of the shearing wheels 9, 10 opens downwardly into an outlet 27 which is followed by a reception container 28 which is connected with the drive block 11 and is intended to receive the cut-off wire ends.

Above the guide slot 7 there is provided in the region of the shearing wheels 9, 10 a conveying roller 29 which consists of foamed plastics material and is driven in rotational movement by a drive motor 30 about an axis which is situated at right angles to the slot plane. As a result uniform conveying of the components 2 is ensured and at the same time these are reliably held in the guide slot 7 during the cutting operation. Drive motor 30 and conveying roller 29 are mounted on a bearing plate 31, and capable of vertical adjustment by means of an adjusting screw 32 for adaptation to different component dimensions. Furthermore, for further improvement in the guiding of the components 2 in the region of the shearing wheels 9, 10, additional guide rails 33 are arranged at the two sides of the guide slot 7.

What is claimed is:

1. Apparatus for cutting to length connecting wires of electrical components, comprising a component guide and a cutting device arranged below the component guide, wherein the component guide comprises a slideway defining a guide slot through which the connecting wires can project downwardly, the cutting device comprises two shearing wheels which are each provided with a peripheral cutting edge and at least one of which is capable of being driven in rotational movement, the shearing wheels having peripheral cutting edges and being arranged one above the other and having facing surfaces abutting on one another and partly overlapping one another so as to form two points of intersection of the peripheral cutting edges, a forward one of said points of intersection, in the direction of rotation of the driven shearing wheel, being situated below the guide slot, and means, engageable with said electrical components, for holding and conveying said electrical components during cutting of said connecting wires, said means for holding and conveying being operable to convey said electrical components in a direction parallel to said guide slot, wherein said means for holding and conveying comprises a conveying roller which is situated above the guide slot in the region of the shearing wheels and is operable to be driven in rotational movement about an axis across the guide slot perpendicular to the slot plane with a circumferential surface arranged for uniformly engaging and conveying said electrical components in a straight line, and wherein the conveying roller is formed of a soft foamed plastic material whereby said roller is inherently adaptable to configurational variations of said components.

2. Apparatus according to claim 1, wherein the said shearing wheels are mounted in a drive block that is liftable and lowerable relative to said guide slot and has surfaces defining a longitudinal slot adjoining the guide slot.

3. Apparatus according to claim 2, wherein the longitudinal slot, downstream of the shearing wheels in the direction of conveyance of the components, opens downwardly into an outlet for cut-off wire ends.

4. Apparatus according to claim 2, including a reception container for cut-off wire ends, said longitudinal slot opening downwardly into said container.

5. Apparatus according to claim 1, wherein the guide slot is arranged with a downward gradient towards the shearing wheels.

6. Apparatus according to claim 1, including a conveying device which is connected to the guide slot.

7. Apparatus according to claim 2, including guide rails which are arranged at an adjustable spacing at least in the region of the shearing wheels at the two sides of the guide slot.

8. Apparatus according to claim 1, wherein the shearing wheels are positioned with a common chord extending between the points of intersection of the shearing wheels below and in the direction of the guide slot.

9. Apparatus according to claim 1, wherein the guide slot in the region of the forward point of intersection of the peripheral cutting edges extends approximately tangentially relative to the upper one of said shearing wheels.

10. Apparatus according to claim 1, wherein the shearing wheels are arranged with their axes parallel to one another and have flat faces which face towards one another.

11. Apparatus according to claim 1, wherein at least one of the shearing wheels is mounted in a freely rotatable manner and abuts, in a yielding manner, on the driven shearing wheel.

12. Apparatus according to claim 11, wherein the freely rotatable shearing wheel is so mounted as to abut on the driven shearing wheel under the action of gravitational force.

13. Apparatus according to claim 1, wherein the lower one of said shearing wheels comprises a working wheel having serrations at its periphery.

14. Apparatus according to claim 13, wherein the serrations comprise a knurling which is coarse relative to the diameter of the connecting wires which are to be cut.

15. Apparatus according to claim 13, wherein the upper of said shearing wheels comprises a co-operating wheel constructed as a truncated cone that widens slightly towards the working wheel.

16. Apparatus for cutting to length connecting wires of electrical components, comprising a component guide and a cutting device arranged below the component guide, wherein the component guide comprises a slideway defining a guide slot through which the connecting wires can project downwardly, the cutting device comprises two shearing wheels which are each provided with a peripheral cutting edge and at least one of which is capable of being driven in rotational movement, the shearing wheels having peripheral cutting edges and being arranged one above the other and having facing surfaces abutting on one another and partly overlapping one another so as to form two points of intersection of the peripheral cutting edges, a forward one of said points of intersection, in the direction of rotation of the driven shearing wheel, being situated below the guide slot, and means, engageable with said electrical components, for holding and conveying said electrical components during cutting of said connecting wires, said means for holding and conveying being operable to convey said electrical components in a direction parallel to said guide slot, wherein the lower one of said shearing wheels comprises a working wheel having serrations at its periphery, the upper of said shearing wheels comprises a co-operating wheel constructed as a truncated cone that widens slightly towards the working wheel, and wherein each of said serrations is in the form of an obtuse-angled isosceles triangle and flanks of which form an acute angle with a line tangent to the other of said shearing wheels at said forward point of intersection, whereby impact stresses on said wires during cutting are minimized.

17. Apparatus according to claim 15 or 16, wherein said co-operating wheel rotates about an axis disposed forwardly of an axis about which said working wheel rotates, and said guide slot is arranged to extend tangentially relative to said co-operating wheel at said forward intersection point, whereby lateral deflection of said connecting wires, after cutting thereof, is avoided.

* * * * *